(12) United States Patent
Kishimoto et al.

(10) Patent No.: US 12,274,002 B2
(45) Date of Patent: Apr. 8, 2025

(54) MULTILAYER CIRCUIT BOARD AND ELECTRONIC-COMPONENT MOUNT MULTILAYER BOARD

(71) Applicant: Murata Manufacturing Co., Ltd., Nagaokakyo (JP)

(72) Inventors: Atsushi Kishimoto, Nagaokakyo (JP); Takumi Masaki, Nagaokakyo (JP); Masato Inaoka, Nagaokakyo (JP); Takashi Shimizu, Nagaokakyo (JP); Hiroshi Nishikawa, Nagaokakyo (JP); Takahiro Takada, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 314 days.

(21) Appl. No.: 18/077,251

(22) Filed: Dec. 8, 2022

(65) Prior Publication Data
US 2023/0101917 A1 Mar. 30, 2023

Related U.S. Application Data

(63) Continuation of application No. PCT/JP2021/021507, filed on Jun. 7, 2021.

(30) Foreign Application Priority Data

Jul. 2, 2020 (JP) .................................. 2020-114911

(51) Int. Cl.
*H05K 1/11* (2006.01)
*H05K 1/02* (2006.01)

(52) U.S. Cl.
CPC ........... *H05K 1/116* (2013.01); *H05K 1/0206* (2013.01); *H05K 2201/0141* (2013.01)

(58) Field of Classification Search
CPC ................ H05K 1/0206; H05K 1/116; H05K 2201/0141
See application file for complete search history.

(56) References Cited

U.S. PATENT DOCUMENTS 6,301,114 B1 * 10/2001 Ootani ................ H01L 23/3677
257/713

FOREIGN PATENT DOCUMENTS

| JP | 2008218618 A | 9/2008 |
| JP | 2018006437 A | 1/2018 |

OTHER PUBLICATIONS

International Search Report in PCT/JP2021/021507, mailed Aug. 17, 2021, 3 pages.
Written Opinion in PCT/JP2021/021507, mailed Aug. 17, 2021, 3 pages.

* cited by examiner

*Primary Examiner* — James Wu
(74) *Attorney, Agent, or Firm* — Keating & Bennett, LLP (57) ABSTRACT

A multilayer circuit board includes a board body including insulator layers stacked upon each other, a first land pattern at the board body to mount a passive component, a second land pattern at the board body to mount an active component, and a heat-dissipation layer between the insulator layers and extending along main surfaces of the insulator layers. The heat-dissipation layer includes a hole extending therethrough in a stacking direction of the insulator layers. In a plan view from the stacking direction, an outer edge of the hole of the heat-dissipation layer is on an outer side of the first land pattern, or overlaps the first land pattern.

20 Claims, 3 Drawing Sheets

MULTILAYER CIRCUIT BOARD AND ELECTRONIC-COMPONENT MOUNT MULTILAYER BOARD

CROSS REFERENCE TO RELATED APPLICATIONS

This application claims the benefit of priority to Japanese Patent Application No. 2020-114911 filed on Jul. 2, 2020 and is a Continuation Application of PCT Application No. PCT/JP2021/021507 filed on Jun. 7, 2021. The entire contents of each application are hereby incorporated herein by reference.

BACKGROUND OF THE INVENTION

1. Field of the Invention

The present invention relates to a multilayer circuit board and an electronic-component mount multilayer board.

2. Description of the Related Art

In an electronic-component mount multilayer board in which an electronic component is mounted on a multilayer circuit board, there is a demand for high heat dissipation due to a reduction in the size of the electronic component, higher integration, and higher speed.

Japanese Unexamined Patent Application Publication No. 2008-218618 discloses a printed wiring board having a structure in which a rigid substrate is integrated with a portion of a flexible substrate having a circuit on at least one surface thereof, the flexible substrate having a graphite layer. According to Japanese Unexamined Patent Application Publication No. 2008-218618, a dedicated cooling component is not required, and a light printed wiring board having excellent heat dissipation characteristics can be provided.

When an active component and a passive component are mounted on the printed wiring board described in Japanese Unexamined Patent Application Publication No. 2008-218618, the graphite layer allows heat that is generated from the active component, which is a heating component, to be conducted to the entire board and to be dissipated into the atmosphere or to a housing. Therefore, the temperature of the active component does not rise easily. However, the heat that has been conducted to the board increases the temperature of the passive component and may cause variations in the characteristics of the passive component.

SUMMARY OF THE INVENTION

Preferred embodiments of the present invention provide multilayer circuit boards each of which, when an active component and a passive component are mounted thereon, are able to make the temperature of the passive component less likely to increase in addition to making the temperature of the active component less likely to increase. Other preferred embodiments of the present invention provide electronic-component mount multilayer boards in each of which an active component and a passive component are mounted on the multilayer circuit board.

A multilayer circuit board according to a preferred embodiment of the present invention includes a board body including a plurality of insulator layers stacked upon each other, a first land pattern at the board body to mount a passive component, a second land pattern provided at the board body to mount an active component, and a heat-dissipation layer between the insulator layers and extending along main surfaces of the insulator layers. The heat-dissipation layer includes a hole extending therethrough in a stacking direction of the insulator layers. In a plan view from the stacking direction, an outer edge of the hole of the heat-dissipation layer is on an outer side of the first land pattern, or overlaps the first land pattern.

An electronic-component mount multilayer board according to a preferred embodiment of the present invention includes a board body including a plurality of insulator layers stacked upon each other, a passive component and an active component mounted at the board body, a first land pattern at the board body to mount the passive component and connected to the passive component, a second land pattern at the board body to mount the active component and connected to the active component, and a heat-dissipation layer between the insulator layers and extending along main surfaces of the insulator layers. The heat-dissipation layer includes a hole extending therethrough in a stacking direction of the insulator layers. In a plan view from the stacking direction, an outer edge of the hole of the heat-dissipation layer is on an outer side of the first land pattern, or overlaps the first land pattern.

According to preferred embodiments of the present invention, it is possible to provide multilayer circuit boards each of which, when an active component and a passive component are mounted thereon, is able to make the temperature of the passive component less likely to increase in addition to making the temperature of the active component less likely to increase.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Multilayer circuit boards and electronic-component mount multilayer boards according to preferred embodiments of the present invention are described below, with reference to the drawings.

However, the present invention is not limited to the preferred embodiments and structures described below, and can be applied by making changes as appropriate within a scope that does not change the spirit of the present invention. The present invention includes combinations of two or more preferred embodiments described below.

Figure 1:
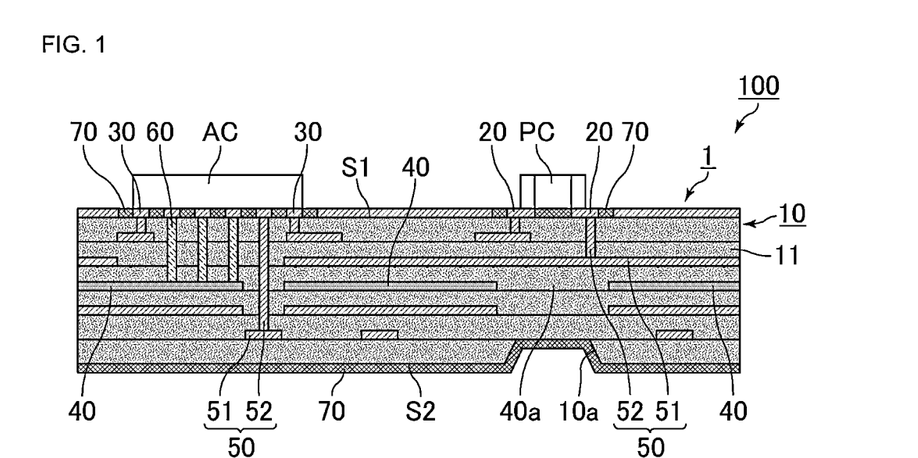
FIG. 1 is a sectional view schematically showing an example of a multilayer circuit board and an example of an electronic-component mount multilayer board according to preferred embodiments of the present invention.

FIG. 1 is a sectional view schematically showing an example of a multilayer circuit board and an example of an electronic-component mount multilayer board according to preferred embodiments of the present invention.

An electronic-component mount multilayer board 100 shown in FIG. 1 includes a multilayer circuit board 1, and a passive component PC and an active component AC that are mounted on the multilayer circuit board 1.

The passive component PC is, for example, a chip component, such as a resistor, a capacitor, or an inductor, a vibrator, or a filter. The active component AC is, for example, a transistor, a diode, or a semiconductor element of an IC, an LSI, or the like.

The multilayer circuit board 1 includes a board body 10, a first land pattern 20 for mounting the passive component PC, a second land pattern 30 for mounting the active component AC, and a heat-dissipation layer 40. The multilayer circuit board 1 further includes, as a wiring conductor 50, a conductor layer 51 and a wiring via 52. It is preferable that the multilayer circuit board 1 further includes a thermal via 60. The multilayer circuit board 1 may further include a protection layer 70.

The board body 10 is a layered body including a plurality of insulator layers 11. The board body 10 includes a first surface S1 and a second surface S2 that oppose each other in a stacking direction of the insulator layers 11. FIG. 1 shows boundaries of insulator layers 11 that are adjacent to each other in the stacking direction. However, the boundaries between the insulator layers 11 sometimes cannot be seen.

Each insulator layer 11 is, for example, a dielectric layer. Each insulator layer 11 may have flexibility.

Each insulator layer 11 is made of, for example, a resin material. The resin material of each insulator layer 11 may be, for example, a liquid crystal polymer (LCP), polyetheretherketone (PEEK), polyetherimide (PEI), polyphenylene sulfide (PPS), or polyimide (PI). Among these, each insulator layer 11 is preferably a resin layer made of thermoplastic resin, such as LCP. The board body 10 can be easily formed by forming each insulator layer 11 by using a resin sheet made of, for example, thermoplastic resin.

Alternatively, each insulator layer 11 may be made of, for example, a ceramic material. The ceramic material of each insulator layer 11 is, for example, a low temperature co-fired ceramic (LTCC) material. A LTCC material refers to a ceramic material that can be sintered at a firing temperature of about 1000° C. or less, and that allows simultaneous sintering with, for example, copper or silver.

The first land pattern 20 is provided at the board body 10 for mounting the passive component PC. In the example shown in FIG. 1, the passive component PC is mounted on a surface of the board body 10, specifically, on the first surface S1 of the board body 10. In this case, the first land pattern 20 is provided on the first surface S1 of the board body 10. The passive component PC may be built inside the board body 10. In this case, the first land pattern 20 is provided inside the board body 10.

The second land pattern 30 is provided at the board body 10 for mounting the active component AC. In the example shown in FIG. 1, the active component AC is mounted on a surface of the board body 10, specifically, on the first surface S1 of the board body 10. In this case, the second land pattern 30 is provided on the first surface S1 of the board body 10. When the passive component PC and the active component AC are each to be mounted on a surface of the board body 10, the passive component PC may be mounted on the first surface S1 of the board body 10, and the active component AC may be mounted on the second surface S2 of the board body 10. In this case, the second land pattern 30 is provided on the second surface S2 of the board body 10. The active component AC may be built inside the board body 10. In this case, the second land pattern 30 is provided inside the board body 10.

The heat-dissipation layer 40 is provided inside the board body 10. Specifically, the heat-dissipation layer 40 is disposed between the insulator layers 11 and is provided along main surfaces of the insulator layers 11.

The surfaces of the heat-dissipation layer 40 are not covered by a conductor, such as copper, for example.

The material of the heat-dissipation layer 40 is, for example, a graphite sheet or a carbon nanotube sheet. Of these, the heat-dissipation layer 40 is preferably a graphite sheet. A graphite sheet is a sheet formed by processing graphite into a sheet. Since a graphite sheet has a higher thermal conductivity in a planar direction than in a thickness direction and is an inexpensive material, a graphite sheet is suitably used as the material of the heat-dissipation layer 40.

The heat-dissipation layer 40 includes a hole 40a extending therethrough in the stacking direction of the insulator layers 11. When seen in plan view from the stacking direction, an outer edge of the hole 40a of the heat-dissipation layer 40 is located on an outer side of the first land pattern 20, or overlaps the first land pattern 20.

Heat that is generated from the active component AC, which is a heating component, is primarily conducted to the heat-dissipation layer 40, and dissipated into the atmosphere or to a housing. It is possible to reduce or prevent heat conduction to the passive component PC by providing the hole 40a of the heat-dissipation layer 40 directly below the first land pattern 20 and eliminating a portion of the heat-dissipation layer 40 disposed directly below the passive component PC. As a result, it is possible to make the temperature of the passive component PC less likely to increase in addition to making the temperature of the active component AC less likely to increase.

The shape of the hole 40a of the heat-dissipation layer 40 when seen in plan view from the stacking direction is not particularly limited, and is, for example, a polygonal shape, such as a square or substantially square shape, or a circular or substantially circular shape, or an elliptical or substantially elliptical shape.

The position of the hole 40a of the heat-dissipation layer 40 is determined by the shape of the first land pattern 20. The shape of the first land pattern 20 differs depending upon, for example, the external shape of the passive component PC, the length, width, or position of a terminal, or the number of terminals.

Figure 2:
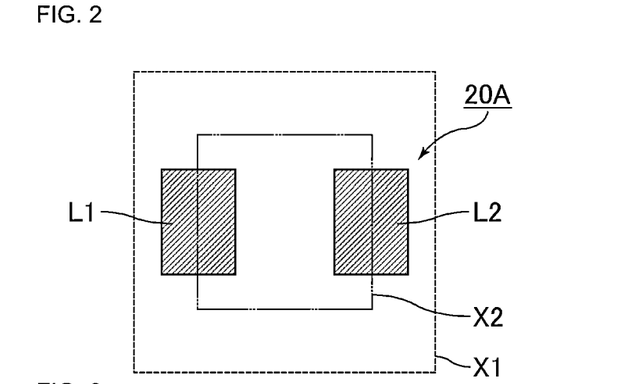
FIG. 2 is a plan view schematically showing an example of a relationship between the position of a hole of a heat-dissipation layer and the shape of a first land pattern.

FIG. 2 is a plan view schematically showing an example of a relationship between the position of a hole of a heat-dissipation layer and the shape of a first land pattern.

In FIG. 2, a first land pattern 20A includes two lands, a land L1 and a land L2, and is formed to allow mounting of a passive component including two terminals. When an outer edge of the hole of the heat-dissipation layer is located at a position denoted by X1 and on outer sides of both of the lands L1 and L2, the outer edge X1 of the hole of the heat-dissipation layer is located on an outer side of the first land pattern 20A. On the other hand, when the outer edge of the hole of the heat-dissipation layer is located at a position denoted by X2 and overlaps both of the lands L1 and L2, the outer edge X2 of the hole of the heat-dissipation layer overlaps the first land pattern 20A.

Figure 3:
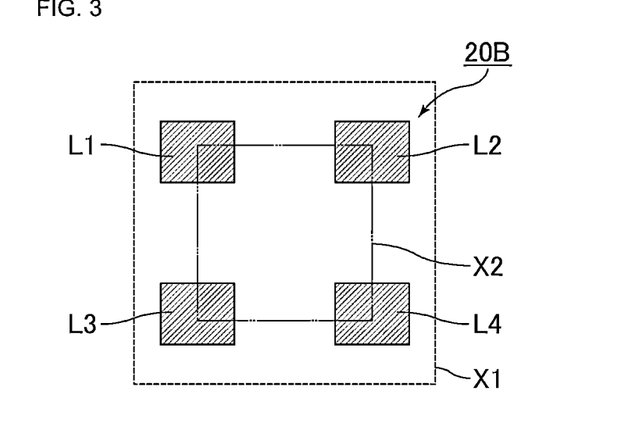
FIG. 3 is a plan view schematically showing a different example of a relationship between the position of a hole of a heat-dissipation layer and the shape of a first land pattern.

FIG. 3 is a plan view schematically showing a different example of a relationship between the position of a hole of a heat-dissipation layer and the shape of a first land pattern.

In FIG. 3, a first land pattern 20B includes four lands, lands L1, L2, L3, and L4, and is formed to allow mounting of a passive component including four terminals. When an outer edge of the hole of the heat-dissipation layer is located at a position denoted by X1 and on outer sides of all of the lands L1, L2, L3, and L4, the outer edge X1 of the hole of the heat-dissipation layer is located on an outer side of the first land pattern 20B. On the other hand, when the outer edge of the hole of the heat-dissipation layer is located at a position denoted by X2 and overlaps all of the lands L1, L2, L3, and L4, the outer edge X2 of the hole of the heat-dissipation layer overlaps the first land pattern 20B.

Figure 4:
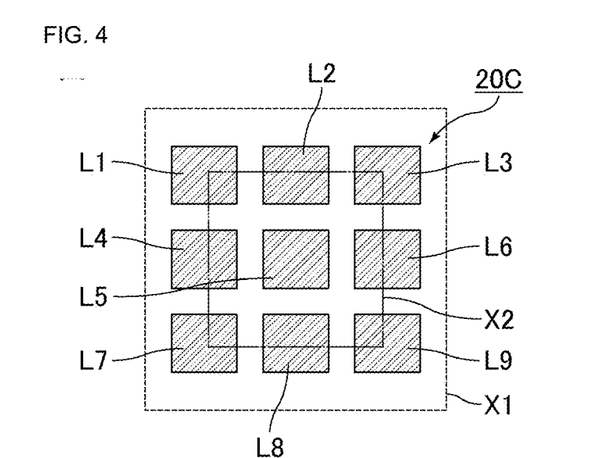
FIG. 4 is a plan view schematically showing a different example of a relationship between the position of a hole of a heat-dissipation layer and the shape of a first land pattern.

FIG. 4 is a plan view schematically showing a different example of a relationship between the position of a hole of a heat-dissipation layer and the shape of a first land pattern.

In FIG. 4, a first land pattern 20C includes nine lands, lands L1, L2, L3, L4, L5, L6, L7, L8, and L9, and is formed to allow mounting of a passive component including nine terminals. When an outer edge of the hole of the heat-dissipation layer is located at a position denoted by X1 and on outer sides of all of the lands L1, L2, L3, L4, L6, L7, L8, and L9 that are located at an outer periphery, the outer edge X1 of the hole of the heat-dissipation layer is located on an outer side of the first land pattern 20C. On the other hand, when the outer edge of the hole of the heat-dissipation layer is located at a position denoted by X2 and overlaps all of the lands L1, L2, L3, L4, L6, L7, L8, and L9 that are located at the outer periphery, the outer edge X2 of the hole of the heat-dissipation layer overlaps the first land pattern 20C.

In the present description, regardless of the number of lands of the first land pattern 20, as in the relationships shown in FIGS. 2, 3, and 4, when the outer edge of the hole 40a of the heat-dissipation layer 40 is located on the outer sides of all of the lands that are located at the outer periphery, the outer edge of the hole 40a of the heat-dissipation layer 40 is located on the outer side of the first land pattern 20. On the other hand, when the outer edge of the hole 40a of the heat-dissipation layer 40 overlaps all of the lands that are located at the outer periphery, the outer edge of the hole 40a of the heat-dissipation layer 40 overlaps the first land pattern 20.

As shown in FIG. 1, it is preferable that the board body 10 includes a recess 10a at, of the surfaces of the board body 10 that oppose each other in the stacking direction, a surface on a side opposite to the first land pattern 20 with the heat-dissipation layer 40 therebetween. If the surface of the board body 10 includes the recess 10a, when seen in plan view from the stacking direction, the outer edge of the recess 10a of the board body 10 is located on an outer side of the first land pattern 20, or overlaps the first land pattern 20. In the example shown in FIG. 1, since the first land pattern 20 is provided on the first surface S1 of the board body 10, the recess 10a is provided in the second surface S2 of the board body 10.

The material of each insulator layer 11 of the board body 10 has a certain degree of thermal conductivity. Therefore, as a result of recessing, of the surfaces of the board body 10, a surface on a side opposite to the first land pattern 20 with the heat-dissipation layer 40 therebetween, it is possible to shorten a heat path from the heat-dissipation layer 40 to the surface of the board body 10 and to increase the surface area of the board body 10. Therefore, heat dissipation into the atmosphere is further accelerated. As a result, it is possible to make the temperature of the active component AC and the temperature of the passive component PC much less likely to increase.

The shape of the recess 10a of the board body 10 when seen in plan view from the stacking direction is not particularly limited, and is, for example, a polygonal shape, such as a square or substantially square shape, or a circular or substantially circular shape, or an elliptical or substantially elliptical shape.

The position of the recess 10a of the board body 10 is determined by the shape of the first land pattern 20.

In the present description, regardless of the number of lands of the first land pattern, as in the relationships shown in FIGS. 2, 3, and 4, when the outer edge of the recess 10a of the board body 10 is located on outer sides of all of the lands that are located at the outer periphery, the outer edge of the recess 10a of the board body 10 is located on the outer side of the first land pattern 20. On the other hand, when the outer edge of the recess 10a of the board body 10 overlaps all of the lands that are located at the outer periphery, the outer edge of the recess 10a of the board body 10 overlaps the first land pattern 20.

The position of the outer edge of the recess 10a of the board body 10 when seen in plan view from the stacking direction need not be the same or substantially the same as the position of the outer edge of the hole 40a of the heat-dissipation layer 40. When seen in plan view from the stacking direction, it is preferable that the position of the outer edge of the recess 10a of the board body 10 is the same or substantially the same as the position of the outer edge of the hole 40a of the heat-dissipation layer 40, or be located inward of the outer edge of the hole 40a of the heat-dissipation layer 40. The area of the recess 10a of the board body 10 when seen in plan view from the stacking direction need not be the same or substantially the same as the area of the hole 40a of the heat-dissipation layer 40. When seen in plan view from the stacking direction, it is preferable that the area of the recess 10a of the board body 10 is the same or substantially the same as the area of the hole 40a of the heat-dissipation layer 40, or be smaller than the area of the hole 40a of the heat-dissipation layer 40.

When the heat-dissipation layer 40 is a graphite sheet, it is preferable that the graphite sheet is a graphite sheet in which graphene having a planar structure is formed into layers by a Van der Waals force, the planar structure having a plurality of carbon atoms bonded in a hexagonal mesh form. It is more preferable that the graphite sheet have a structure in which graphene is formed into layers with a graphene planar direction (XY plane) being orthogonal or substantially orthogonal to a thickness direction (Z direction). In this case, the thermal conductivity of the graphite sheet in the planar direction can be made higher than the thermal conductivity thereof in the thickness direction.

Although the thickness of the graphite sheet is not particularly limited, the thickness is preferably, for example, about 10 μm or greater and more preferably about 20 μm or greater. On the other hand, for example, the thickness of the graphite sheet is preferably about 200 μm or less, more preferably about 100 μm or less, and even more preferably about 80 μm or less.

The thickness of the graphite sheet is calculated as an average value of measured values obtained by measuring the thickness at any 10 points.

Although the thermal conductivity of the graphite sheet in the planar direction is not particularly limited, the thermal conductivity is preferably about 700 W/mk or greater, more preferably about 1000 W/mk or greater, even more preferably about 1500 W/mk or greater, and particularly preferably about 1800 W/mk or greater, for example.

The thermal conductivity of the graphite sheet in the planar direction is calculated by the following Formula (1):

$$A = \alpha \times d \times C_p \quad (1)$$

Here, A is the thermal conductivity of the graphite sheet, α is the thermal diffusivity of the graphite sheet, d is the density of the graphite sheet, and Cp is the specific heat capacity of the graphite sheet.

A thermal diffusivity measuring device (for example, thermowave analyzer TA manufactured by Bethel Co., Ltd.) based on the spot periodic heating radiation thermometry method is used to measure the thermal diffusivity of the graphite sheet at an ambient temperature of about 25° C. for a sample of graphite sheet cut out into a shape measuring about 50 mm×about 50 mm.

The density of the graphite sheet is calculated for a sample of graphite sheet cut out into a shape measuring about 50 mm×about 50 mm by measuring its weight and thickness and dividing the measured weight value by the calculated volume value (about 50 mm×about 50 mm×thickness).

A differential scanning calorimeter (for example, DSC Q2000 manufactured by TA Instruments) is used to measure the specific heat capacity of the graphite sheet under a temperature-increasing condition of about 10° C./min from about 20° C. to about 260° C.

Although the electrical conductivity of the graphite sheet is not particularly limited, the electrical conductivity is preferably about 7000 S/cm or greater, more preferably about 10000 S/cm or greater, even more preferably about 13000 S/cm or greater, and particularly preferably about 18000 S/cm or greater, for example. On the other hand, the electrical conductivity of the graphite sheet is preferably about 25000 S/cm or less and more preferably about 20000 S/cm or less, for example.

By using, for example, Loresta-GP manufactured by Mitsubishi Chemical Analytech Co., Ltd., the electrical conductivity of the graphite sheet can be measured by applying a constant current by a four probe method.

Although the density of the graphite sheet is not particularly limited, the density is preferably about 0.8 g/cm³ or greater, and more preferably about 1.8 g/cm³ or greater, for example. On the other hand, the density of the graphite sheet is preferably about 2.2 g/cm³ or less, for example.

As a commercially available graphite sheet, for example, graphinity manufactured by Kaneka Corporation or PGS (registered trademark) manufactured by Panasonic Corporation can be used.

As shown in FIG. 1, the multilayer circuit board 1 further includes, as the wiring conductor 50, the conductor layer 51 and the wiring via 52. The conductor layer 51 is provided at a surface of the board body 10 or inside the board body 10. Specifically, the conductor layer 51 is provided along the main surfaces of the insulator layers 11, and is disposed at surfaces of the insulator layers 11 or between the insulator layers 11. The wiring via 52 is provided so as to extend through at least one insulator layer 11 in the stacking direction.

The conductor layer 51 is made of, for example, a single metal, such as copper, silver, aluminum, stainless steel (SUS), nickel, or gold, or an alloy of two or more different types of metals selected from such metals.

The wiring via 52 is made of, for example, a metal material, such as silver, copper, a silver alloy, or a copper alloy. The silver alloy is an alloy whose main component is silver, and the copper alloy is an alloy whose main component is copper. The main component of an alloy refers to a component having the highest weight percentage, and preferably refers to a component whose weight percentage exceeds 50 wt %.

As shown in FIG. 1, it is preferable that the multilayer circuit board 1 further include the thermal via 60. The thermal via 60 extends through at least one insulator layer 11 in the stacking direction. When the multilayer circuit board 1 includes the thermal via 60, it is preferable that one end portion of the thermal via 60 be connected to the second land pattern 30, and that the other end portion of the thermal via 60 be connected to the heat-dissipation layer 40.

The thermal via 60 is made of, for example, a metal material, such as silver, copper, a silver alloy, or a copper alloy. It is preferable that the thermal via 60 is made of a metal material that is the same as the metal material of the wiring via 52. Alternatively, the thermal via 60 may be made of a ceramic material, such as, for example, nitride ceramic, oxide ceramic, or a mixture thereof. The nitride ceramic is, for example, aluminum nitride (AlN), boron nitride (BN), or silicon nitride ($Si_3N_4$). The oxide ceramic is, for example, alumina ($Al_2O_3$).

As shown in FIG. 1, the multilayer circuit board 1 may further include the protection layer 70. The protection layer 70 is provided on a surface of the board body 10. The protection layer 70 is, for example, a solder resist film or a cover lay film. The protection layer 70 may be provided on both or one of the first surface S1 and the second surface S2 of the board body 10. Since the protection layer 70 is not an indispensable structure, the protection layer 70 need not be provided on the first surface S1 and the second surface S2 of the board body 10.

The multilayer circuit board according to the above-described preferred embodiment of the present invention is fabricated, for example, as follows. A non-limiting example of a method of fabricating a resin multilayer board as an example of a multilayer circuit board according to a preferred embodiment of the present invention is described, the resin multilayer board including a resin layer as a dielectric layer that is an example of an insulator layer.

First, a resin sheet with a conductor foil is prepared. The resin sheet including the conductor foil is a sheet having a structure in which the conductor foil is adhered to one surface of a resin layer. The resin layer is made of, for example, a thermoplastic resin, such as LCP. Instead of LCP, the material of the resin layer may be, for example, PEEK, PEI, PPS, or PI. The conductor foil is, for example, a foil made of copper and having a thickness of about 18 μm. Instead of copper, the material of the conductor foil may be, for example, a single metal, such as silver, aluminum, stainless steel, nickel, or gold, or an alloy of two or more different types of metals selected from such metals. The thickness of the conductor foil only needs to be a thickness that allows circuit formation, and is, for example, about 3 μm or greater and 40 μm or less.

Next, a resin-layer-side surface of the resin sheet with the conductor foil is irradiated with carbon dioxide gas laser light to form a via hole that extends through the resin layer. The via hole is formed to extend through the resin layer, but is formed not to extend through the conductor foil. Thereafter, any smear of the via hole is removed. In order to form the via hole, another type of laser light may be used instead of carbon dioxide gas laser light. In order to form the via hole, a method other than irradiation with laser light may be used.

Next, by using a method, such as screen printing, for example, a resist pattern corresponding to a desired circuit pattern is printed on a surface of the conductor foil of the resin sheet with the conductor foil.

Thereafter, etching is performed with the resist pattern as a mask, to remove a portion of the conductor foil that is not covered by the resist pattern. A conductor layer having a desired conductor pattern is formed on one surface of the resin layer by removing the resist pattern.

Next, the via hole is filled with a conductive paste using a method, such as screen printing, for example. Although the main component of the conductive paste may be silver, the main component may be, for example, copper instead of silver. It is preferable that the conductive paste include a suitable quantity of metal powder that forms an alloy layer with a metal that is the material of the conductor pattern at a temperature for thermocompression bonding of resin layers that are subsequently stacked (hereunder called "thermocompression bonding temperature"). When the conductive paste includes copper as a main component, it is preferable that the conductive paste include, in addition to the main component, at least one of silver and nickel and at least one of tin, bismuth, and zinc, for example. In this way, a wiring via is formed. Further, it is preferable that a thermal via be formed at a predetermined position.

If necessary, punching is performed with respect to the resin layer at a portion that becomes a recess of a board body. As a method of forming a hole for forming the recess, a method other than punching may be used. For example, the hole may be formed by laser processing.

A graphite sheet is separately prepared. Punching is performed with respect to the graphite sheet at a portion directly below a passive component where the graphite sheet does not exist and at a portion where a wire passes. As a method of forming a hole, a method other than punching may be used. For example, the hole may be formed by laser processing.

The graphite sheet and the resin sheet including the conductor layer and the wiring via are placed upon each other to fabricate a temporary layered body, and the obtained temporary layered body is heated and compressed to obtain the resin multilayer board.

The multilayer circuit board of the present invention is not limited to the preferred embodiment described above as along as, when seen in plan view from the stacking direction, the outer edge of the hole of the heat-dissipation layer is located on the outer side of the first land pattern or overlaps the first land pattern. Therefore, with regard to, for example, the structure and manufacturing conditions of the multilayer circuit board, various applications and modifications can be made within the scope of the present invention. With regard to the electronic-component mount multilayer board, similarly, various applications and modifications can be made within the scope of the present invention.

For example, a plurality of passive components may be mounted at the multilayer circuit board. That is, the multilayer circuit board may include a plurality of first land patterns for mounting a corresponding one of the passive components. For example, when two passive components are both mounted on a surface of the board body, both of the passive components may be mounted on the first surface of the board body, or one of the passive components may be mounted on the first surface of the board body and the other passive component may be mounted on the second surface of the board body.

When a plurality of passive components are mounted at the multilayer circuit board, the hole may be provided in the heat-dissipation layer with respect to at least one passive component in accordance with the position of the first land pattern for mounting the passive component. It is preferable that the recess is provided in the board body with respect to the first land pattern where the hole is provided in the heat-dissipation layer. When the hole is provided in the heat-dissipation layer with respect to two or more passive components in accordance with the positions of the first land patterns for mounting a corresponding one of the passive components, the first land pattern where the recess is provided in the board body and the first land pattern where the recess is not provided in the board body may coexist.

A plurality of active components may be mounted at the multilayer circuit board. That is, the multilayer circuit board may include a plurality of second land patterns for mounting a corresponding one of the active components. For example, when two active components are both mounted on a surface of the board body, both of the active components may be mounted on the first surface of the board body, or one of the active components may be mounted on the first surface of the board body and the other active component may be mounted on the second surface of the board body.

When a plurality of active components are mounted at the multilayer circuit board, it is preferable to provide a thermal via with respect to at least one active component, the thermal via connecting the heat-dissipation layer and the second land pattern for mounting the active component.

The multilayer circuit board may be a flexible board or a rigid board.

EXAMPLES

Examples that more specifically describe the multilayer circuit board and the electronic-component mount multilayer board according to preferred embodiments of the present invention are described below. The present invention is not limited to only these examples.

Example 1-1

Figure 5:
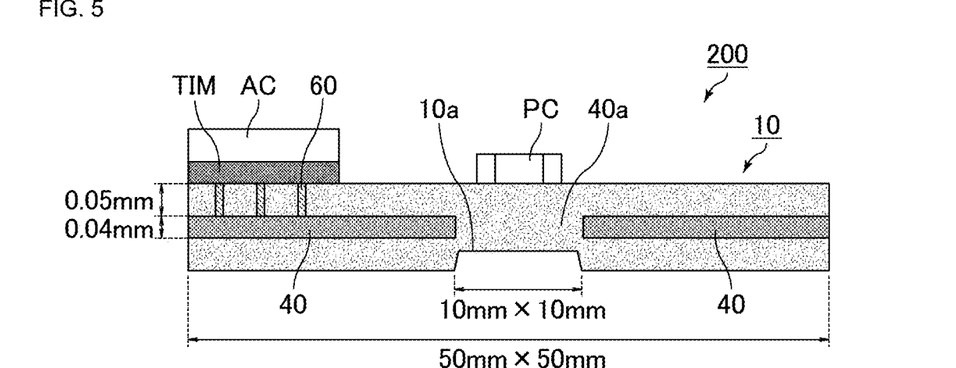
FIG. 5 is a sectional view schematically showing a layered body in Example 1-1 of a preferred embodiment of the present invention.

FIG. 5 is a sectional view schematically showing a layered body in Example 1-1. In the present example, a layered body considered to be a resin multilayer board being an example of a multilayer circuit board was fabricated. In order to direct attention to heat characteristics, a conductor layer, a wiring via, and a protection layer were not formed.

By a method of fabricating the resin multilayer board above, a layered body 200 measuring about 50 mm×about 50 mm×thickness of about 0.14 mm (of which the thickness of a graphite sheet was about 0.04 mm) was fabricated. In FIG. 5, using TIM (thermal interface material) having a thermal conductivity of about 2 W/mK and a thickness of about 0.2 mm, a 10 mm×10 mm ceramic heater was installed on a location corresponding to a disposition portion of an active component AC being a heating component. Nine thermal vias 60 having a diameter of about 0.15 mm were uniformly disposed directly below the ceramic heater. At a portion corresponding to a disposition portion of a passive component PC located at the center or approximate of the layered body 200, a 10 mm×10 mm hole 40a was formed in a graphite sheet being a heat-dissipation layer 40, and a 10 mm×10 mm recess 10a having a thickness of about 0.04 mm was provided in an opposite surface of a board body 10. That is, in the present example, an active component and a passive component were not disposed.

Figure 6:
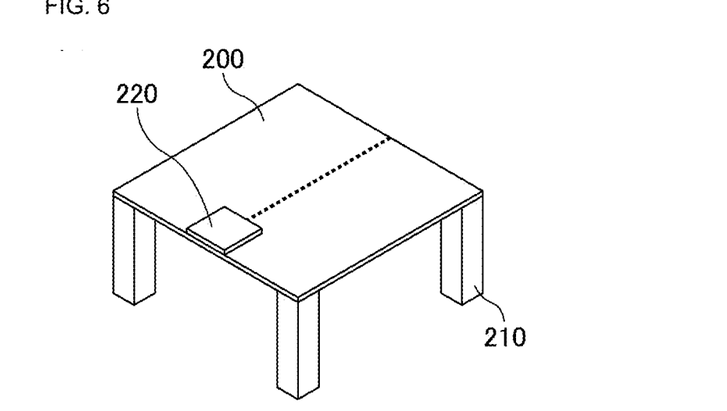
FIG. 6 is a perspective view for describing a method of measuring the temperature of the layered body.

FIG. 6 is a perspective view for describing a method of measuring the temperature of the layered body. As shown in FIG. 6, the layered body 200 was installed on four heat-insulating blocks (about 5 mm×about 5 mm, height of about 20 mm) 210, and the temperature distribution when a ceramic heater 220 generated heat at about 8 W was photographed by a thermography camera (not shown) installed at a top portion of the layered body 200. The temperature distribution of a portion indicated by a dotted line in FIG. 6 was measured.

Figure 7:
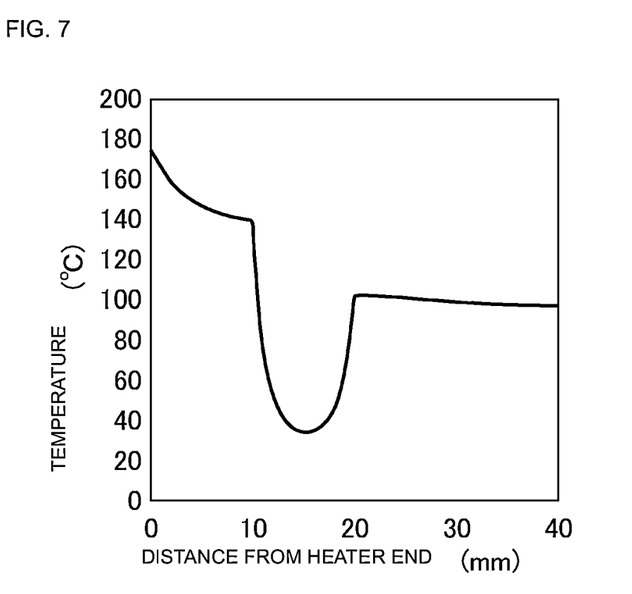
FIG. 7 is a graph showing the temperature distribution of a portion shown by a dotted line in FIG. 6.

FIG. 7 is a graph showing the temperature distribution of the portion shown by the dotted line in FIG. 6. FIG. 7 shows that the temperature decreases at a portion where the hole exists in the graphite sheet and where the recess exists in the opposite surface of the board body.

Example 1-2

Except that an opposite surface of a board body was not provided with a recess, a layered body was fabricated in the same or substantially the same manner as that in Example 1-1, and the temperature distribution was measured.

Comparative Example 1-1

Except that a graphite sheet was not provided with a hole, a layered body was fabricated in the same or substantially the same manner as that in Example 1-1, and the temperature distribution was measured.

Comparative Example 1-2

Except that an opposite surface of a board body was not provided with a recess and a graphite sheet was not provided with a hole, a layered body was fabricated in the same or substantially the same manner as that in Example 1-1, and the temperature distribution was measured.

Table 1 shows the heater temperatures and the temperatures of the disposition portions of the passive components for Example 1-1, Example 1-2, Comparative Example 1-1, and Comparative Example 1-2.

TABLE 1

| | Hole of graphite sheet | Recess of board body | Heater temperature | Temperature of disposition portion of passive component | Temperature difference from Example 1-2 |
|---|---|---|---|---|---|
| Example 1-1 | 10 mm × 10 mm | 10 mm × 10 mm | 190° C. | 34° C. | 5° C. |
| Example 1-2 | 10 mm × 10 mm | none | 190° C. | 39° C. | — |
| Comparative Example 1-1 | none | 10 mm × 10 mm | 185° C. | 115° C. | — |
| Comparative Example 1-2 | none | none | 185° C. | 115° C. | — |

Compared with Comparative Example 1-2 in which a hole of the graphite sheet and a recess of the board body are not provided, in Comparative Example 1-1 in which the board body is provided with a recess, the temperature of the disposition portion of the passive component is unchanged, while in Example 1-2 in which the graphite sheet is provided with a hole, the heater temperature is increased by about 5° C., whereas the temperature of the disposition portion of the passive component is decreased. Further, in Example 1-1 in which the hole of the graphite sheet and the recess of the board body are provided, the temperature of the disposition portion of the passive component is about 5° C. lower than that of Example 1-2. Therefore, it is possible to decrease the temperature of the disposition portion of the passive component by providing the hole of the graphite sheet and the recess of the board body.

Example 2-1

Except that a hole of a graphite sheet and a recess of a board body, where a disposition portion of a passive component was provided, were changed in size to about 5 mm×about 5 mm, a layered body was fabricated in the same or substantially the same manner as that in Example 1-1, and the temperature distribution was measured.

Example 2-2

Except that an opposite surface of a board body was not provided with a recess, a layered body was fabricated in the same or substantially the same manner as that in Example 2-1, and the temperature distribution was measured.

Comparative Example 2-1

Except that a graphite sheet was not provided with a hole, a layered body was fabricated in the same or substantially the same manner as that in Example 2-1, and the temperature distribution was measured.

Comparative Example 2-2

Except that an opposite surface of a board body was not provided with a recess and a graphite sheet was not provided with a hole, a layered body was fabricated in the same or substantially the same manner as that in Example 2-1, and the temperature distribution was measured.

Table 2 shows the heater temperatures and the temperatures of the disposition portions of the passive components for Example 2-1, Example 2-2, Comparative Example 2-1, and Comparative Example 2-2.

TABLE 2

| | Hole of graphite sheet | Recess of board body | Heater temperature | Temperature of disposition portion of passive component | Temperature difference from Example 2-2 |
|---|---|---|---|---|---|
| Example 2-1 | 5 mm × 5 mm | 5 mm × 5 mm | 186° C. | 61° C. | 9° C. |
| Example 2-2 | 5 mm × 5 mm | none | 186° C. | 70° C. | — |
| Comparative Example 2-1 | none | 5 mm × 5 mm | 185° C. | 115° C. | — |
| Comparative Example 2-2 | none | none | 185° C. | 115° C. | — |

Compared with Comparative Example 2-2 in which a hole of the graphite sheet and a recess of the board body are not provided, in Comparative Example 2-1 in which the board body is provided with a recess, the temperature of the disposition portion of the passive component is unchanged, while in Example 2-2 in which the graphite sheet is provided with a hole, the heater temperature is increased by about 1° C., whereas the temperature of the disposition portion of the passive component is decreased. Further, in Example 2-1 in which the hole of the graphite sheet and the recess of the board body are provided, the temperature of the disposition portion of the passive component is about 9° C. lower than that of Example 2-2. Therefore, it is possible to maximally decrease the temperature of the disposition portion of the passive component by providing the hole of the graphite sheet and the recess of the board body.

Example 3-1

Except that a hole of a graphite sheet and a recess of a board body, where a disposition portion of a passive component was provided, were changed in size to about 3 mm×about 3 mm, a layered body was fabricated in the same or substantially the same manner as that in Example 1-1, and the temperature distribution was measured.

Example 3-2

Except that an opposite surface of a board body was not provided with a recess, a layered body was fabricated in the same or substantially the same manner as that in Example 3-1, and the temperature distribution was measured.

Comparative Example 3-1

Except that a graphite sheet was not provided with a hole, a layered body was fabricated in the same or substantially the same manner as that in Example 3-1, and the temperature distribution was measured.

Comparative Example 3-2

Except that an opposite surface of a board body was not provided with a recess and a graphite sheet was not provided with a hole, a layered body was fabricated in the same or substantially the same manner as that in Example 3-1, and the temperature distribution was measured.

Table 3 shows the heater temperatures and the temperatures of the disposition portions of the passive components for Example 3-1, Example 3-2, Comparative Example 3-1, and Comparative Example 3-2.

TABLE 3

| | Hole of graphite sheet | Recess of board body | Heater temperature | Temperature of disposition portion of passive component | Temperature difference from Example 3-2 |
|---|---|---|---|---|---|
| Example 3-1 | 3 mm × 3 mm | 3 mm × 3 mm | 185° C. | 84° C. | 8° C. |
| Example 3-2 | 3 mm × 3 mm | none | 185° C. | 92° C. | — |
| Comparative Example 3-1 | none | 3 mm × 3 mm | 185° C. | 115° C. | — |
| Comparative Example 3-2 | none | none | 185° C. | 115° C. | — |

Compared with Comparative Example 3-2 in which a hole of the graphite sheet and a recess of the board body are not provided, in Comparative Example 3-1 in which the board body is provided with a recess, the temperature of the disposition portion of the passive component is unchanged, while in Example 3-2 in which the graphite sheet is provided with a hole, the heater temperature is unchanged and the temperature of the disposition portion of the passive component is decreased. Further, in Example 3-1 in which the hole of the graphite sheet and the recess of the board body are provided, the temperature of the disposition portion of the passive component is about 8° C. lower than that of Example 3-2. Therefore, it is possible to greatly decrease the temperature of the disposition portion of the passive component by providing the hole of the graphite sheet and the recess of the board body.

Example 4-1

Except that a hole of a graphite sheet and a recess of a board body, where a disposition portion of a passive component was provided, were changed in size to about 2 mm×about 2 mm, a layered body was fabricated in the same or substantially the same manner as that in Example 1-1, and the temperature distribution was measured.

Example 4-2

Except that an opposite surface of a board body was not provided with a recess, a layered body was fabricated in the same or substantially the same manner as that in Example 4-1, and the temperature distribution was measured.

Comparative Example 4-1

Except that a graphite sheet was not provided with a hole, a layered body was fabricated in the same or substantially the same manner as that in Example 4-1, and the temperature distribution was measured.

Comparative Example 4-2

Except that an opposite surface of a board body was not provided with a recess and a graphite sheet was not provided with a hole, a layered body was fabricated in the same or substantially the same manner as that in Example 4-1, and the temperature distribution was measured.

Table 4 shows the heater temperatures and the temperatures of the disposition portions of the passive components for Example 4-1, Example 4-2, Comparative Example 4-1, and Comparative Example 4-2.

TABLE 4

| | Hole of graphite sheet | Recess of board body | Heater temperature | Temperature of disposition portion of passive component | Temperature difference from Example 4-2 |
|---|---|---|---|---|---|
| Example 4-1 | 2 mm × 2 mm | 2 mm × 2 mm | 185° C. | 98° C. | 5° C. |
| Example 4-2 | 2 mm × 2 mm | none | 185° C. | 103° C. | — |
| Comparative Example 4-1 | none | 2 mm × 2 mm | 185° C. | 115° C. | — |
| Comparative Example 4-2 | none | none | 185° C. | 115° C. | — |

Compared with Comparative Example 4-2 in which a hole of the graphite sheet and a recess of the board body are not provided, in Comparative Example 4-1 in which the board body is provided with a recess, the temperature of the disposition portion of the passive component is unchanged, while in Example 4-2 in which the graphite sheet is provided with a hole, the heater temperature is unchanged and the temperature of the disposition portion of the passive component is decreased. Further, in Example 4-1 in which the hole of the graphite sheet and the recess of the board body are provided, the temperature of the disposition portion of the passive component is about 5° C. lower than that of Example 4-2. Therefore, it is possible to decrease the temperature of the disposition portion of the passive component by providing the hole of the graphite sheet and the recess of the board body.

Example 5-1

Except that a hole of a graphite sheet and a recess of a board body, where a disposition portion of a passive component was provided, were changed in size to about 1 mm×about 1 mm, a layered body was fabricated in the same or substantially the same manner as that in Example 1-1, and the temperature distribution was measured.

Example 5-2

Except that an opposite surface of a board body was not provided with a recess, a layered body was fabricated in the same way as that in Example 5-1, and the temperature distribution was measured.

Comparative Example 5-1

Except that a graphite sheet was not provided with a hole, a layered body was fabricated in the same or substantially the same manner as that in Example 5-1, and the temperature distribution was measured.

Comparative Example 5-2

Except that an opposite surface of a board body was not provided with a recess and a graphite sheet was not provided with a hole, a layered body was fabricated in the same or substantially the same manner as that in Example 5-1, and the temperature distribution was measured.

Table 5 shows the heater temperatures and the temperatures of the disposition portions of the passive components for Example 5-1, Example 5-2, Comparative Example 5-1, and Comparative Example 5-2.

TABLE 5

|  | Hole of graphite sheet | Recess of board body | Heater temperature | Temperature of disposition portion of passive component | Temperature difference from Example 5-2 |
|---|---|---|---|---|---|
| Example 5-1 | 1 mm × 1 mm | 1 mm × 1 mm | 185° C. | 110° C. | 2° C. |
| Example 5-2 | 1 mm × 1 mm | none | 185° C. | 112° C. | — |
| Comparative Example 5-1 | none | 1 mm × 1 mm | 185° C. | 115° C. | — |
| Comparative Example 5-2 | none | none | 185° C. | 115° C. | — |

Compared with Comparative Example 5-2 in which a hole of the graphite sheet and a recess of the board body are not provided, in Comparative Example 5-1 in which the board body is provided with a recess, the temperature of the disposition portion of the passive component is unchanged, while in Example 5-2 in which the graphite sheet is provided with a hole, the heater temperature is unchanged and the temperature of the disposition portion of the passive component is decreased. Further, in Example 5-1 in which the hole of the graphite sheet and the recess of the board body are provided, the temperature of the disposition portion of the passive component is about 2° C. lower than that of Example 5-2. Therefore, it is possible to decrease the temperature of the disposition portion of the passive component by providing the hole of the graphite sheet and the recess of the board body.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A multilayer circuit board comprising:
   a board body including a plurality of insulator layers stacked upon each other;
   a first land pattern at the board body to mount a passive component;
   a second land pattern at the board body to mount an active component; and
   a heat-dissipation layer between the insulator layers and extending along main surfaces of the insulator layers; wherein
   the heat-dissipation layer includes a hole extending therethrough in a stacking direction of the insulator layers; and
   in a plan view from the stacking direction, an area of the hole of the heat-dissipation layer is on an outer side of the first land pattern and overlaps the first land pattern.
2. The multilayer circuit board according to claim 1, wherein
   with respect to surfaces of the board body that oppose each other in the stacking direction, the board body includes a recess at the surface of the board body on a side opposite to the first land pattern with the heat-dissipation layer therebetween; and
   in the plan view from the stacking direction, an outer edge of the recess of the board body is on an outer side of the first land pattern, or overlaps the first land pattern.
3. The multilayer circuit board according to claim 1, further comprising:
   a thermal via extending through the insulator layers in the stacking direction; wherein
   one end portion of the thermal via is connected to the second land pattern, and another end portion of the thermal via is connected to the heat-dissipation layer.
4. The multilayer circuit board according to claim 1, wherein the heat-dissipation layer is a graphite sheet.
5. The multilayer circuit board according to claim 1, wherein each of the plurality of insulator layers are resin layers made of thermoplastic resin.
6. The multilayer circuit board according to claim 1, wherein each of the plurality of insulator layers includes a liquid crystal polymer, polyetheretherketone, polyetherimide, polyphenylene sulfide, or polyimide.
7. The multilayer circuit board according to claim 1, wherein each of the plurality of insulator layers includes a low temperature co-fired ceramic material.

8. The multilayer circuit board according to claim 1, wherein the heat-dissipation layer is a carbon nanotube sheet.

9. The multilayer circuit board according to claim 1, wherein the first land pattern includes four lands.

10. The multilayer circuit board according to claim 1, wherein the first land pattern includes nine lands.

11. An electronic-component mount multilayer board comprising:
 a board body including a plurality of insulator layers stacked upon each other;
 a passive component and an active component mounted at the board body;
a first land pattern at the board body to mount the passive component and connected to the passive component;
 a second land pattern at the board body to mount the active component and connected to the active component; and
 a heat-dissipation layer between the insulator layers and extending along main surfaces of the insulator layers; wherein
 the heat-dissipation layer includes a hole extending therethrough in a stacking direction of the insulator layers; and
 in a plan view from the stacking direction, an area of the hole of the heat-dissipation layer is on an outer side of the first land pattern and overlaps the first land pattern.

12. The electronic-component mount multilayer board according to claim 11, wherein
 with respect to surfaces of the board body that oppose each other in the stacking direction, the board body includes a recess at the surface of the board body on a side opposite to the first land pattern with the heat-dissipation layer therebetween; and
 in the plan view from the stacking direction, an outer edge of the recess of the board body is on an outer side of the first land pattern, or overlaps the first land pattern.

13. The electronic-component mount multilayer board according to claim 11, further comprising:
 a thermal via extending through the insulator layers in the stacking direction; wherein
 one end portion of the thermal via is connected to the second land pattern, and another end portion of the thermal via is connected to the heat-dissipation layer.

14. The electronic-component mount multilayer board according to claim 11, wherein the heat-dissipation layer is a graphite sheet.

15. The electronic-component mount multilayer board according to claim 11, wherein the insulator layers are resin layers made of thermoplastic resin.

16. The electronic-component mount multilayer board according to claim 11, wherein each of the plurality of insulator layers includes a liquid crystal polymer, polyetheretherketone, polyetherimide, polyphenylene sulfide, or polyimide.

17. The electronic-component mount multilayer board according to claim 11, wherein each of the plurality of insulator layers includes a low temperature co-fired ceramic material.

18. The electronic-component mount multilayer board according to claim 11, wherein the heat-dissipation layer is a carbon nanotube sheet.

19. The electronic-component mount multilayer board according to claim 11, wherein the first land pattern includes four lands.

20. The electronic-component mount multilayer board according to claim 11, wherein the first land pattern includes nine lands.

* * * * *